United States Patent
Putnam et al.

(10) Patent No.: US 6,319,737 B1
(45) Date of Patent: Nov. 20, 2001

(54) METHOD AND APPARATUS FOR CHARACTERIZING A SEMICONDUCTOR DEVICE

(75) Inventors: Gary Gene Putnam, San Jose; Jennifer Meng-Tzu Cheng, Mountain View; Chin-Yang Sun, Ukiah, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/371,498

(22) Filed: Aug. 10, 1999

(51) Int. Cl.[7] .................................................. H01L 21/66
(52) U.S. Cl. ........................... 438/17; 439/622; 29/25.01
(58) Field of Search ................................. 118/719; 437/8; 257/773; 324/158.1; 438/17, 592, 622

(56) References Cited

U.S. PATENT DOCUMENTS

| | | | |
|---|---|---|---|
| 5,719,495 | * 2/1998 | Moslehi | 324/158.1 |
| 5,726,920 | 3/1998 | Chen et al. | |
| 5,866,437 | 2/1999 | Chen et al. | |
| 6,013,536 | * 1/2000 | Nowak | 438/17 |
| 6,019,850 | * 2/2000 | Frey | 118/719 |
| 6,136,618 | * 10/2000 | Masaru | 438/17 |
| 6,162,715 | * 12/2000 | Mak | 438/592 |
| 6,171,945 | * 1/2001 | Mandal | 438/622 |

FOREIGN PATENT DOCUMENTS

| | | |
|---|---|---|
| 0660385A2 | 6/1995 | (EP) . |
| 97/13158 | 4/1997 | (WO) . |

OTHER PUBLICATIONS

"IC Performance Prediction System", V. Ramakrishnan et al., Proceedings of the International Test Conference (ITC), New York, IEEE, Oct. 21, 1995, p. 336–344.
"Global Yield Engineering for IC Production", E.A. Sack, Solid State Technology, Cowan Publ. Corp., Washington, vol. 41, No. 12, Dec. 1, 1998, p. 81–85.
International Search Report.

* cited by examiner

Primary Examiner—John F. Niebling
Assistant Examiner—Andre' Stevenson (57) ABSTRACT

A method and apparatus are provided for providing characterization data for semiconductor devices. A first data set containing measured results obtained from wafer electrical tests performed on the semiconductor device during the fabrication process is compared to a second data set containing values corresponding to design characteristics for the semiconductor device. Based on this comparison, semiconductor devices having valid and invalid performance characteristics are identified. The characterization results data are subsequently generated for the identified semiconductor devices.

22 Claims, 9 Drawing Sheets

Char Data Tables

DS_GB_TAB 185R x 8C   Proposed Data Sheet Limits
based on 5 Splits and 3 Temperatures from
CHIPSET1_304H Grouped Characterization Data DS_LOW (Data Sheet Low Limit), DS_HIGH (Data Sheet High Limit)
The value in these colums represents the Original Data Sheet Limits
or is Replaced with the
Worse Case Parameter Median +/- 3 Std Dev for Marginal Parameters when
a Value is Present in either the ORIGINAL DS_LOW or ORIGINAL DS_HIGH Colums TYPICAL = Median of All Splits data for the center VCC at 25C Data only
Example: VCCs used 4.75V, 5.0V & 5.2V. The Center VCC is 5.0V

| | DS_PARAM | ORIGINAL DS_LOW | DS_LOW | TYPICAL | DS_HIGH | ORIGINAL DS_HIGH | UNITS |
|---|---|---|---|---|---|---|---|
| 1 | C1_1 | 1.5 | 1.0 | 2.52 | 10.00 | | nS |
| 2 | C1_3 | 1.5 | 1.0 | 2.56 | 10.00 | | nS |
| 3 | C3_1 | | 0.0 | 5.37 | 8.00 | | nS |
| 4 | C3_3 | | 0.0 | 5.43 | 8.00 | | nS |
| 5 | C4_1 | | -3.0 | 0.51 | 2.00 | | nS |
| 6 | C4_3 | | -3.0 | 0.52 | 2.00 | | nS |
| 7 | C5_1 | 1.5 | 1.3 | 2.76 | 10.00 | | nS |
| 8 | C5_3 | 1.5 | 1.3 | 2.75 | 10.00 | | nS |
| 9 | C6_BWE_1 | 1.5 | 0.6 | 1.96 | 9.00 | | nS |
| 10 | C6_BWE_3 | 1.5 | 0.5 | 1.93 | 9.00 | | nS |
| 11 | C6_GWE_1 | 1.5 | 0.7 | 2.18 | 9.00 | | nS |
| 12 | C6_GWE_3 | 1.5 | 0.8 | 2.17 | 9.00 | | nS |
| 13 | C7_1 | 1.5 | 1.3 | 2.59 | 7.00 | | nS |
| 14 | C7_3 | 1.5 | 1.1 | 2.65 | 7.00 | | nS |
| 15 | C8_1 | 1.5 | 1.3 | 2.74 | 7.00 | | nS |
| 16 | C8_3 | 1.5 | 1.2 | 2.78 | 7.00 | | nS |

Page 1

METHOD AND APPARATUS FOR CHARACTERIZING A SEMICONDUCTOR DEVICE

BACKGROUND OF THE INVENTION

1. Technical Field

The present invention relates to semiconductor device design and fabrication and, more particularly, to a method and apparatus for analyzing characterization data for a semiconductor device.

2. Description of the Related Art

The requirements for high density performance associated with ultra large scale integration semiconductor devices continue to escalate, hence requiring design features of 0.25 microns and under (e.g., 0.18 microns and under), increased transistor and circuit speeds, high reliability, and increased manufacturing throughput for competitiveness. For example, memory devices are one class of semiconductor devices that require high-density performance and ultra large-scale integration. The reduction of design features to 0.25 microns and under challenges the limitations of conventional semiconductor manufacturing techniques. Moreover, as design features are reduced into the deep submicron range, it becomes increasingly difficult to maintain or improve manufacturing throughput for competitiveness.

Market forces continue to demand higher capability and faster circuits. In order to satisfy market demands, the size of individual chips is increased to accommodate more transistors. A reduction in the size of the individual transistors also accounts for a greater number of transistors on each chip. Furthermore, in order to maintain satisfactory productivity and yield, it is necessary to process larger wafers, often at much higher costs, and utilize automatic handling equipment in order to maintain uniformity across larger wafers and between different wafers.

The Ultra Large Scale Integration (ULSI) era has significantly increased the number of process steps associated with the fabrication of wafers. The number of tests necessary to maintain product quality has also increased drastically. Consequently, it has become progressively more difficult to generate characterization data for complex semiconductor devices. The characterization data corresponds to product attributes and variables data collected from assembled units from die on wafers that have been processed either to standard or specific modifications of the associated fabrication process. For example, the characterization data includes: information that indicates the process versus product yield; distribution of results from various tests performed on the fabricated devices, such as transition time for switching between a high state and a low state; percentage of devices that generate unsatisfactory results for specific tests; performance of fabricated devices relative to design requirements; etc.

Accurate characterization of product performance and circuit parameters is crucial for providing product stability. For example, the product characterization data can summarize test results on the same device type to compare the product performance results to the wafer electrical tests (WET) of the fabrication process. Based on the test results, an engineer can determine which WET characteristics effect the product performance and/or yield either in a positive or negative way. The engineer may then relate this information to the product design and fabrication engineers to determine if the product needs to be re-designed to meet the fabrication process area or the process can be retargeted for the best product performance and yield. In addition, proper characterization ensures that a particular device displays appropriate performance characteristics and conforms to customer specifications.

Traditional approaches to generating characterization data require that numerous wafer electrical tests (WET) be conducted on selected semiconductor devices that are formed on the wafer during the fabrication process. The WET data collected represents various electrical parameters (e.g., electrical conductivity, resistance, and transition time from a low to high state, etc.) that the product designers must consider when using the associated engineering design rules (EDR) in the design of a semiconductor device. As the number of fabrication steps has increased, so too has the number of tests that must be performed on the wafer in order to accurately monitor fabrication of the semiconductor device.

In order to generate characterization data that accurately represents the product design, packaged units must be assembled from wafers that exhibit those WET characteristics that most closely match the EDR requirements. Analysis of the data provides the engineer with information to verify the product design and how the product performance relates to the fabrication process area.

Accordingly, one problem associated with current methods of generating characterization data for semiconductor devices, is the amount of time required to thoroughly analyze the collected variables data. Another problem associated with current methods of generating characterization data is the inconsistency associated with the data analysis when multiple engineers must analyze different portions of the data.

DISCLOSURE OF THE INVENTION

There is a need for an arrangement for quickly analyzing data collected from a semiconductor device characterization and generating consistent result summaries that can be used to quickly identify product performance and yield issues. These result summaries can also be used to communicate the product performance and/or yield issues to the design and fabrication engineers.

These and other needs are addressed by the present invention, wherein characterization data for a semiconductor device is quickly and consistently analyzed by comparing the measured test results from fabricated semiconductor devices to specific performance limit criteria based on the design simulation and customer requirements included in the product test program.

In accordance with one aspect of the invention, a method is provided for generating product characterization reports for a semiconductor device. The method comprises the steps: compiling a WET data set containing measured results from WET tests performed on wafers from characterization lots formed from a prescribed fabrication process; generating WET reports from the WET data set for determining a group of wafers most suitable to be assembled for characterization tests; compiling a characterization data set containing measured results from characterization tests performed on the assembled semiconductor units; analyzing the characterization data set to identify those characterization test parameters that fail the performance requirements; determining whether the characterization data set needs modification based on the analyzing of the characterization data set; and generating product characterization reports for the semiconductor device based on the valid data set. The present method allows generation of product characterization reports for complex semiconductor devices in a fraction of the time traditionally required by quickly examining the data collected from the fabrication process and the characterization tests. Additionally, the characterization reports are accurately and consistently generated because prescribed statistical analyses are used instead of human intuition from multiple engineers.

Hence, an engineer may easily review WET data to accurately select wafers that meet engineering design rules. Package units can then be assembled from the selected wafers for product variables data collection. The characterization data set enables quick identification of any semiconductor devices that do not meet prescribed performance limits based on the measured characterization test parameters.

Additional advantages and novel features of the present invention will be set forth in part in the description which follows, and in part will become apparent to those skilled in the art upon examination of the following, or may be learned by practice of the invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF THE PREFERRED EMBODIMENT

A method and apparatus are described for generating characterization data for a semiconductor device. In the description that follows, numerous specific details are set forth, for purposes of explanation, in order to provide a thorough understanding of the present invention. It will be apparent to those skilled in the art, however, that the present invention may be practiced without these specific details. In other instances, well-known structures and devices are shown in block diagram form in order to avoid unnecessarily obscuring the present invention.

HARDWARE OVERVIEW

Figure 1A:
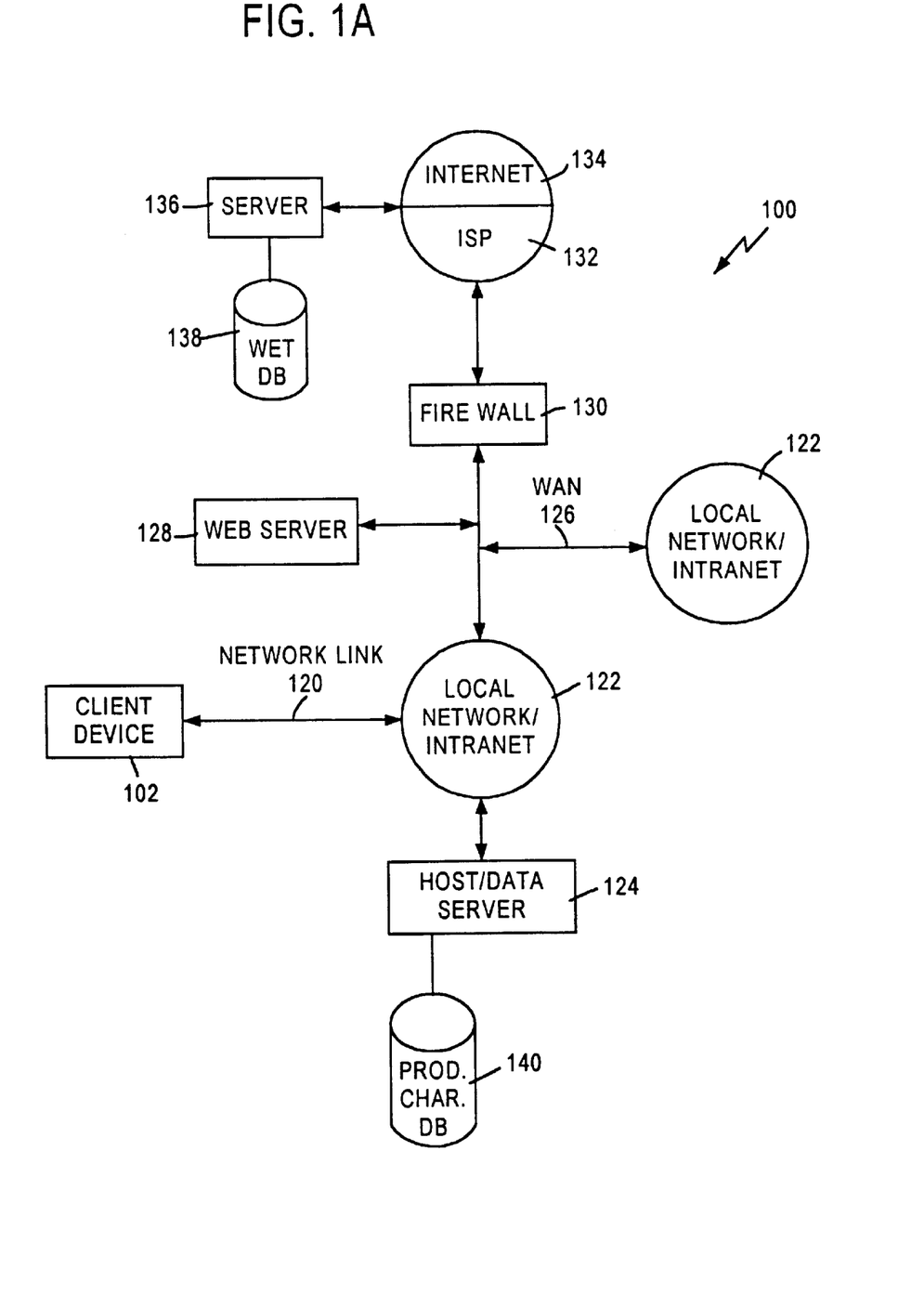
FIGS. 1A and 1B are block diagrams summarizing illustration of a computer system upon which an embodiment of the invention may be implemented.

FIG. 1A is a block diagram that illustrates a computer system 100 for generating characterization data and reports according to an embodiment of the present invention. The computer system 100 includes a client device 102, for example a computer workstation executing a client browser-type software, an HyperText Transport Protocol (HTTP) based web server 128 configured for processing HTTP-based requests from the client device 102, and a host/data server 124 configured for storing and supplying data and reports to the web server 128 and/or the client 102, and a local network/intranet 122 for transporting the client requests and the data and reports between the client device 102 and the server 124 and 128 via network links 120. As recognized in the art, the client device 102, the server 124, and the server 128 communicate amongst each other according to a prescribed network protocol, for example TCP/IP.

As described below, the system 100 generates characterization data for a semiconductor device by execution of one or more sequences of one or more instructions by the client device 102, and/or by performing a remote procedure call of an identified routine or a specified software component residing elsewhere in the system 100.

The term "computer-readable medium" as used herein refers to any medium (e.g., optical or magnetic disks, random access or read only memory, electromagnetic or optical energy carrier waves, etc.) that participates in providing instructions to the client device 102 for execution.

The network link 120 typically provides data communication with other servers in communication with the local network/intranet 122. For example, the system 100 includes a firewall server 130 for providing network security to the local network/intranet 122, and a server 136 accessable by the client device 102 via a wide area network, for example the Internet 134, by utilizing access services of an internet service provider (ISP 132). For example, the network link 120 may provide a connection through the local network 122 to a host computer 124 or to data equipment operated by an Internet Service Provider (ISP) 126. The ISP 126 in turn provides data communication services through the world wide packet data communication network now commonly referred to as the "Internet" 128 (or the World Wide Web). Alternatively, the client device may access the server 136 via a private wide area packet switched network.

Figure 1B:
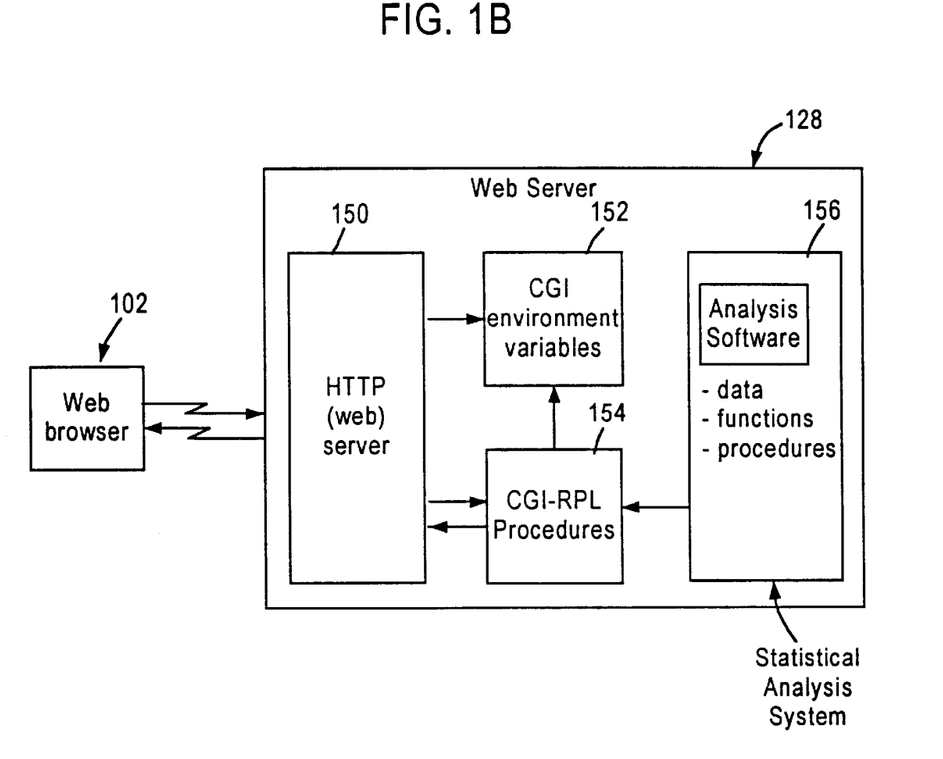

The server 128 illustrated in detail in FIG. 1B combines web server and Microsoft FrontPage client/server environments to provide a platform independent system that embeds a nominal or split lot product characterization methodology with statistical analysis to transform data into information automatically without the user specifying data analysis routines. This system integrates CGI/JavaScrip (dynamic HTML), database connectivity, and database functions/ capabilities for maximum system performance. It allows multiple users to share the information from anywhere via the Internet 134.

As shown in FIG. 1B, the web server 128 includes an HTTP (web) server process 150, a Common Gateway Interface (CGI) environment variable process 152 that stores and executes and supports prescribed routines that are executable by other processes executable within the network 100. The web server 128 also includes a CGI-RPL (Research Programming Language) procedures library 154 for executing prescribed operation in response to CGI or RPL function calls. As described below, a subset of the CGI-RPL procedures stored in the library 154 include database queries to an analysis software database 156, for example databases 138 and 140 which may be physically within the web server 128, or remotely located, for example within host/data server 124 or server 136.

GENERATING CHARACTERIZATION DATA ANALYSIS AND REPORTS

Figure 2:
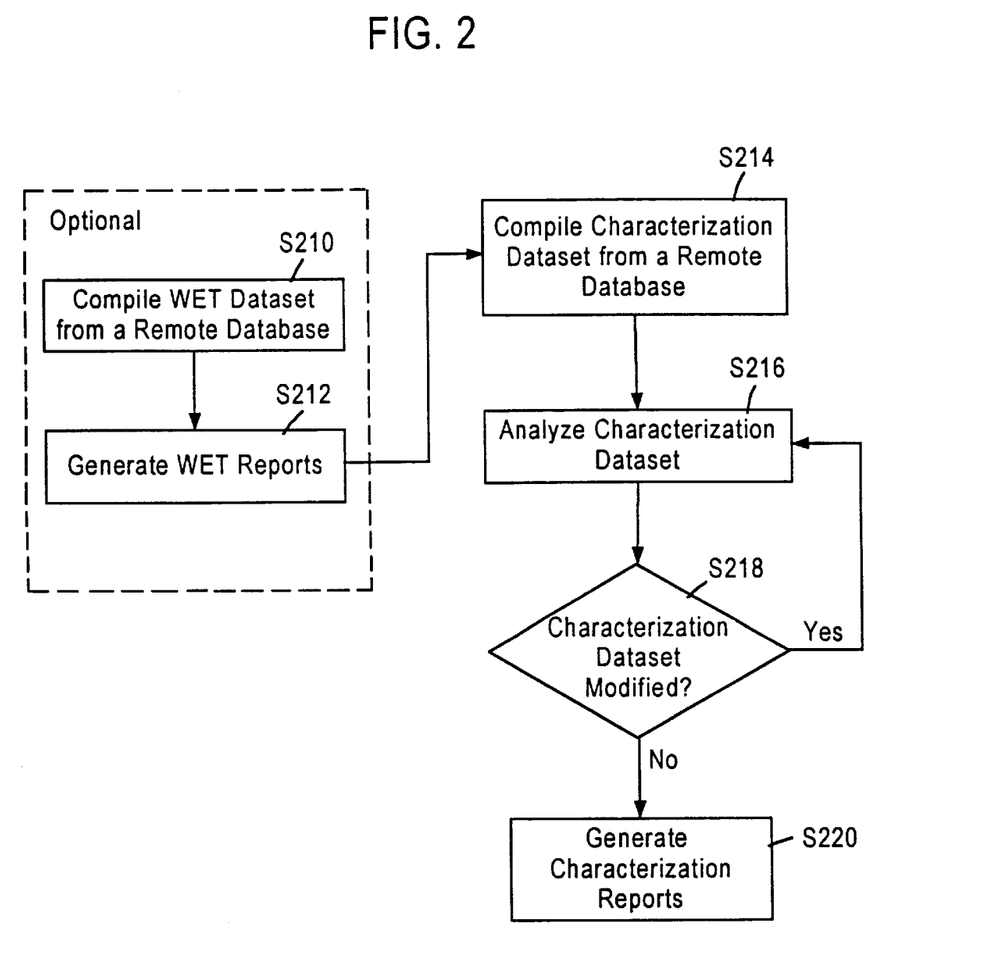
FIG. 2 is a flow chart illustrating the steps performed to generate product characterization reports data for a semiconductor device according to an embodiment of the present invention.

FIG. 2 is a flow diagram illustrating an overview of the steps performed in order to generate product characterization reports for semiconductor devices according to an embodiment of the present invention. At step S210, a WET data set for the product characterization lots is compiled from a remote database 138, such as from host 124 or server 136 by the client device 102 during execution on a computer workstation being operated by a design or product engineer. Access to the remote database is provided by the web server 128 through the LAN 122, through the WAN 126, or through the Internet 134 via an appropriate ISP 132. The WET data set, once compiled, may be stored for example on magnetic or optical media. Retrieval of the specific data from the WET data may thus requires transmission of the WET data set within the LAN 122. According to one embodiment of the present invention, the WET data set is generally stored in a database 138 on a remote computer workstation or server 124 or 136. Access to the WET data set, and transfer thereof, is provided through the WAN 126 via a Web server 128 or through the Internet 134 via an appropriate ISP 132. In typical situations, however, the WET data set will be stored on computer-readable media such as a hard disk that can be accessed by the engineer's workstation. As described below, a product characterization database 140 stores proposed data sheet specifications for products, plus product characterization reports generated by the system 100.

According to the disclosed embodiment the client workstation 102 collects characterization data (including WET data) and generates product characterization reports by sending client requests to the web server 128. The user at the workstation 102 opens his/or Web browser and enters the URL to the remote server 128. The connection to the web server 128 is made. The user is now able to run the product characterization software system via the Web interface.

Figure 6:
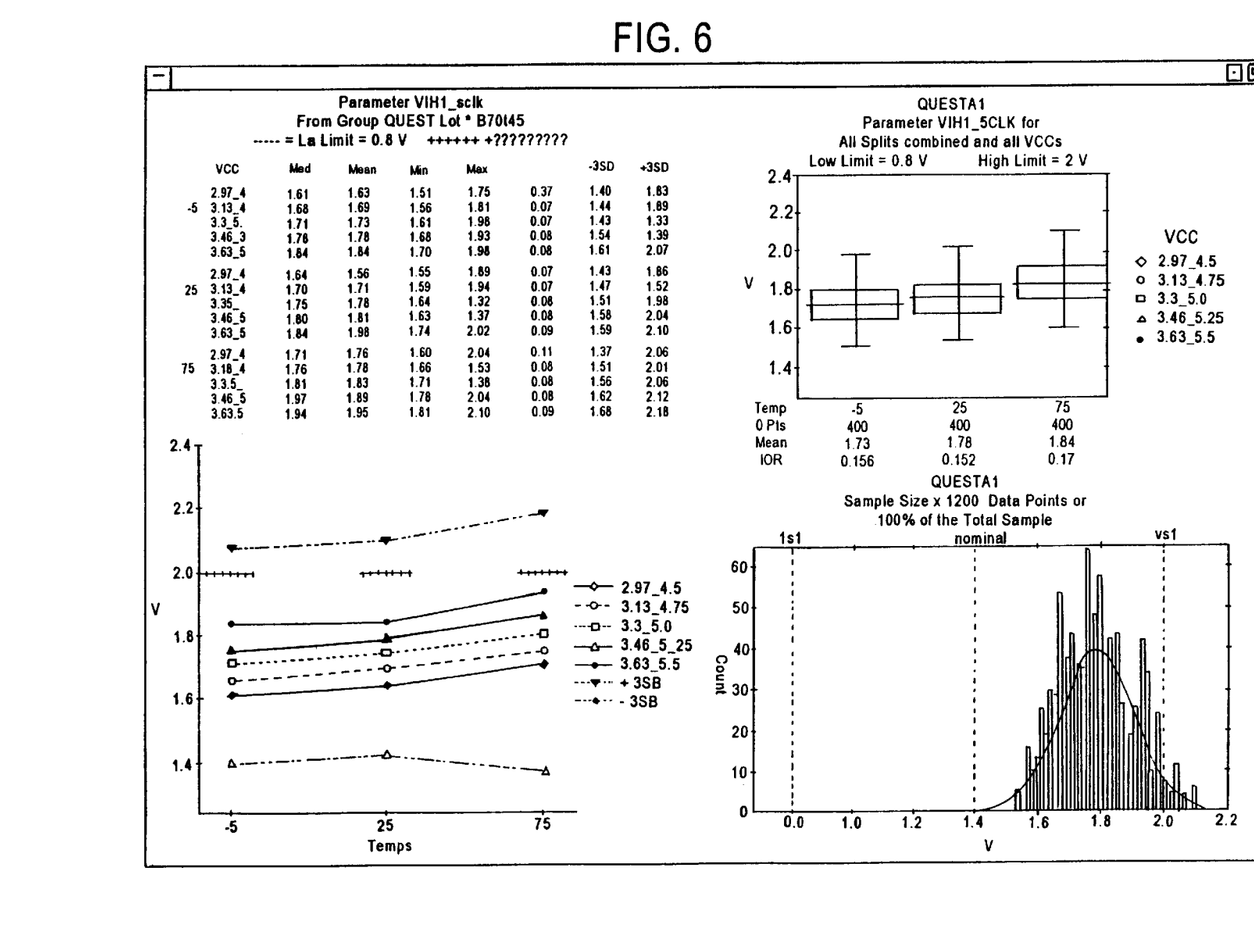
FIG. 6 is a diagram illustrating a graphical report presented to a user at a client workstation for comparing measured electrical tests with characterization test results according to an embodiment of the present invention.

The database connectivity feature allows data to be loaded to the web server 128 from databases 138 or 140 or from ASCII files. Once the product characterization variables data are loaded, the embedded analysis routine automatically begins. As described below, this automated analysis identifies those tested parameters that: 1) Do not respond to input stimulation, 2) Are found to be outside the defined test program limits, 3) Are found to have outliers or bimodal distributions. Utilizing Web browser pages, the user or multiple users are able to load/view data, manipulate data, and/or view analysis results from tables and graphs (FIG. 6).

The WET data set contains measured results from tests that are performed on the wafers and semiconductor devices (e.g., transistors, MOS gates, memory devices, etc.) after fabrication (i.e., WET data). For example, many such tests involve detecting specific electrical properties (i.e., conductivity, resistance, etc.) of the wafer for semiconductor devices.

Referring to step S212 in FIG. 2, statistics from specific WET tests performed at various physical locations on the wafer may be reported for each wafer and grouped wafers. The statistical distribution of the entire WET data set for specific WET tests may be compared to the overall fabrication process. The client device 102 presents the engineer with reports and graphs that can easily be reviewed to determine and to select the most suitable wafers to be assembled into individual units for product characterization test in order to obtain the best match with the design simulation conditions and entire fabrication process window.

Although the disclosed embodiment is configured to be fully functional for generating product characterization reports without compiling a WET data set (steps S210 and S212), the review of WET results prior to selecting units for characterization tests may provide a more representative sample. Furthermore, the WET data set establishes a basis to relate the characterization results back to the fabrication process. At step S212, data from specific WET tests may be examined for their impact on characterization test results once the characterization data set is available. The engineer is then presented with results and graphs, illustrated in FIG. 6, that can be easily reviewed to locate potential optimum conditions in the fabrication process and to determine which particular steps should be adjusted, closely monitored, etc., in order to improve the overall yield.

Figure 7:
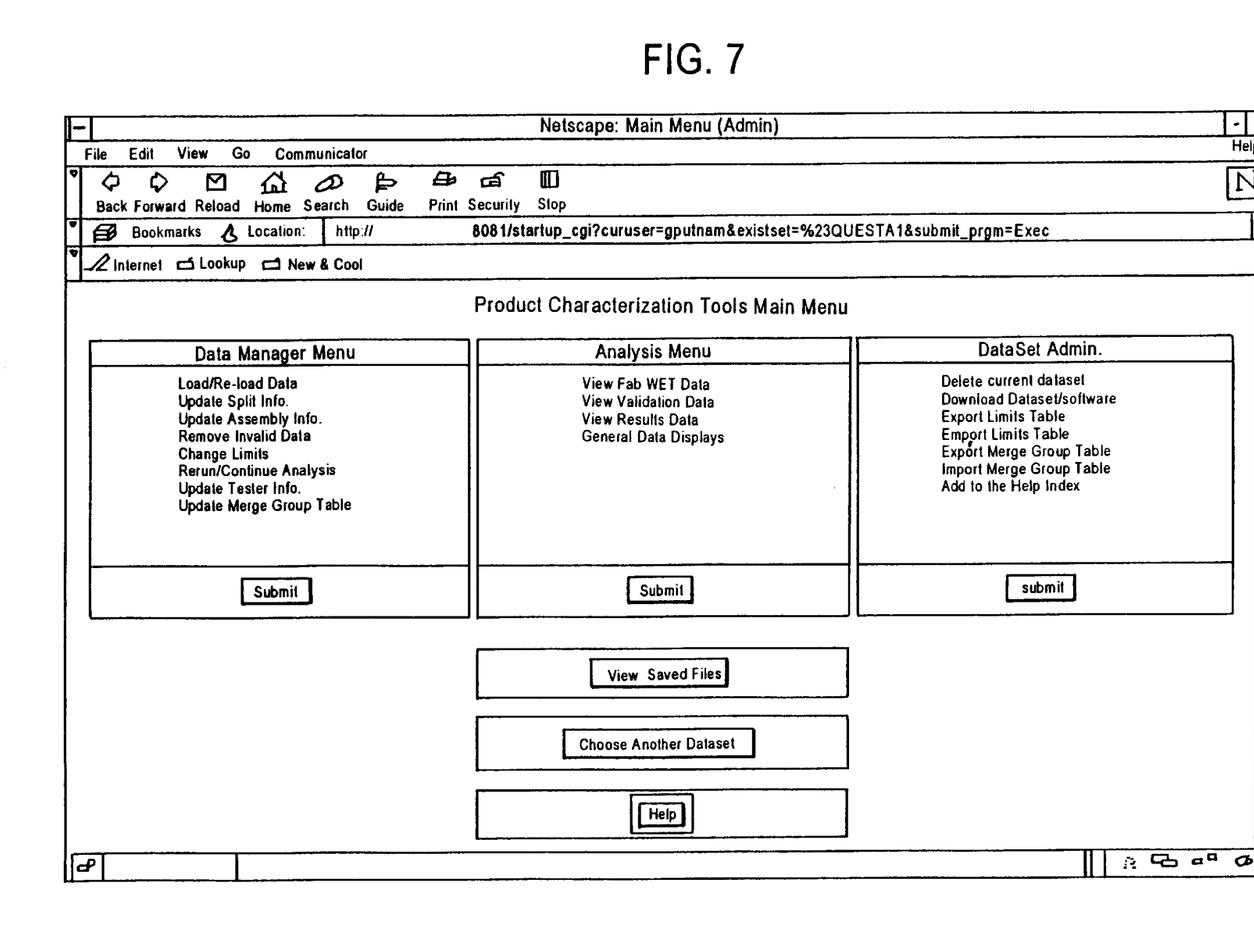
FIG. 7 is a diagram illustrating a display of a browser software executable on a client workstation for executing product characterization routines according to an embodiment of the present invention.

At step S214, a characterization variables data set is compiled from a remote database (e.g., at server 136) by the engineer's workstation 102. Specifically, the client device 102 sends a request to the web server 128 that the characterization variables data set be compiled from the remote database 138. The "Product Characterization Tools Main Menu", as shown in FIG. 7, allows users to access all features and functionalities. The system consists of three sections: Data Manage, Analysis, and DataSet Admin. The Analysis section allows the users to view the analysis results. The users can "clean" the data after reviewing reports by removing invalid data, changing limits, or reloading data from re-tested units via various Web pages contained in the "Data Manage" and "DataSet Admin." sections of the Main Menu page.

The web server 150, in response to the client request from the web browser, initiates a function call to the CGI/RPL procedures library 154 that includes all necessary parameters as specified by the client request and/or any variables accessed by the HTTP server 150 from the variables table 152. The library 154 executes an instance of the specified procedure, for example by generating a SQL query to the remote database 138. Similar to the WET data set, the characterization variables data set may be stored, for example, in a database 140 that is local or remote to the host/data server 124. Access to the characterization variables data set would similarly require transmission within the LAN 122, through the WAN 126, or through the Internet 134.

The characterization variables data set contains measured results from tests that are performed on the semiconductor device units after assembly, from selected wafers based on the corresponding WET data, and values that correspond to the design characteristics specified by a preliminary product data sheet or a customer. For example, a customer may require that a particular microchip contain specific circuits capable of transitioning from a low state to a high state within a prescribed time interval, or conduct a certain current value at a certain bias voltage under specified or ambient temperature conditions. All such values may be contained within the characterization variables data set. Additionally, the engineers responsible for designing the microchip may place further constraints in order to ensure reliability and quality assurance.

The WET database 138 and the product characterization database 140 generally reside on two different workstations or servers, for example servers 124 and 136, respectively. For example, the product characterization database 140 may reside on a computer workstation that is located within a research and development facility, while the WET database 138 resides on a computer workstation located within a fabrication facility. Both compiled WET data set and characterization variables data set alternatively may be stored on a same computer locally or remotely in order to improve efficiency.

At step S216, the measured values for specific characterization tests performed on the semiconductor units and stored in databases 138 and/or 140 are compared to the corresponding preliminary design characteristics requirements contained in the characterization variables data set. Data from specific characterization tests are also examined to identify abnormal statistical distributions. The engineer is then presented with results and graphs as illustrated in FIG. 6 that can be reviewed easily to evaluate whether the measured values from tests and the preliminary design requirements are valid and/or there are product design, fabrication process, assembly, test program or test equipment issues.

At step S218, the engineer at the client workstation 102 determines whether the resulting data is valid. If the resulting data is valid, then the product characterization reports for semiconductor devices are generated by the server 124 and stored in the database 140 in step S220. If the resulting data is not valid, then the engineer may modify various data containing the characterization data set or change the product design, fabrication process, assembly, test program, or test equipment. In either case, a modified characterization data set is generated and stored in database 140, followed by a return to step S216.

At step S220, the final product characterization reports are generated by the server 124 for engineers to review. Characterization data set that has been determined as valid is further analyzed. Characterization test parameters with marginal results are identified. Values from specific tests performed on the assembled units are compared, for example, to values for the same tests at different temperatures. Characterization data is summarized for all test parameters in a variety of ways. Typical value and worst case test parameters, values, and operation conditions (such as temperatures and supply voltages) are also reported, grouped by product data sheet functionality. Reports on effects in operation changes (e.g., temperature delta report) are also provided. A new set of proposed limits for the product data sheet is also generated based on the actual characterization data. The engineer is then presented with graphs to determine whether the product design functions over the operating ranges specified by the data sheet and whether it can be manufactured with an acceptable yield over the entire fabrication windows in order to release the device for production successfully. The characterization reports are generated quickly and in a manner that will repeatedly produce consistent results from the first data set.

Figure 3:
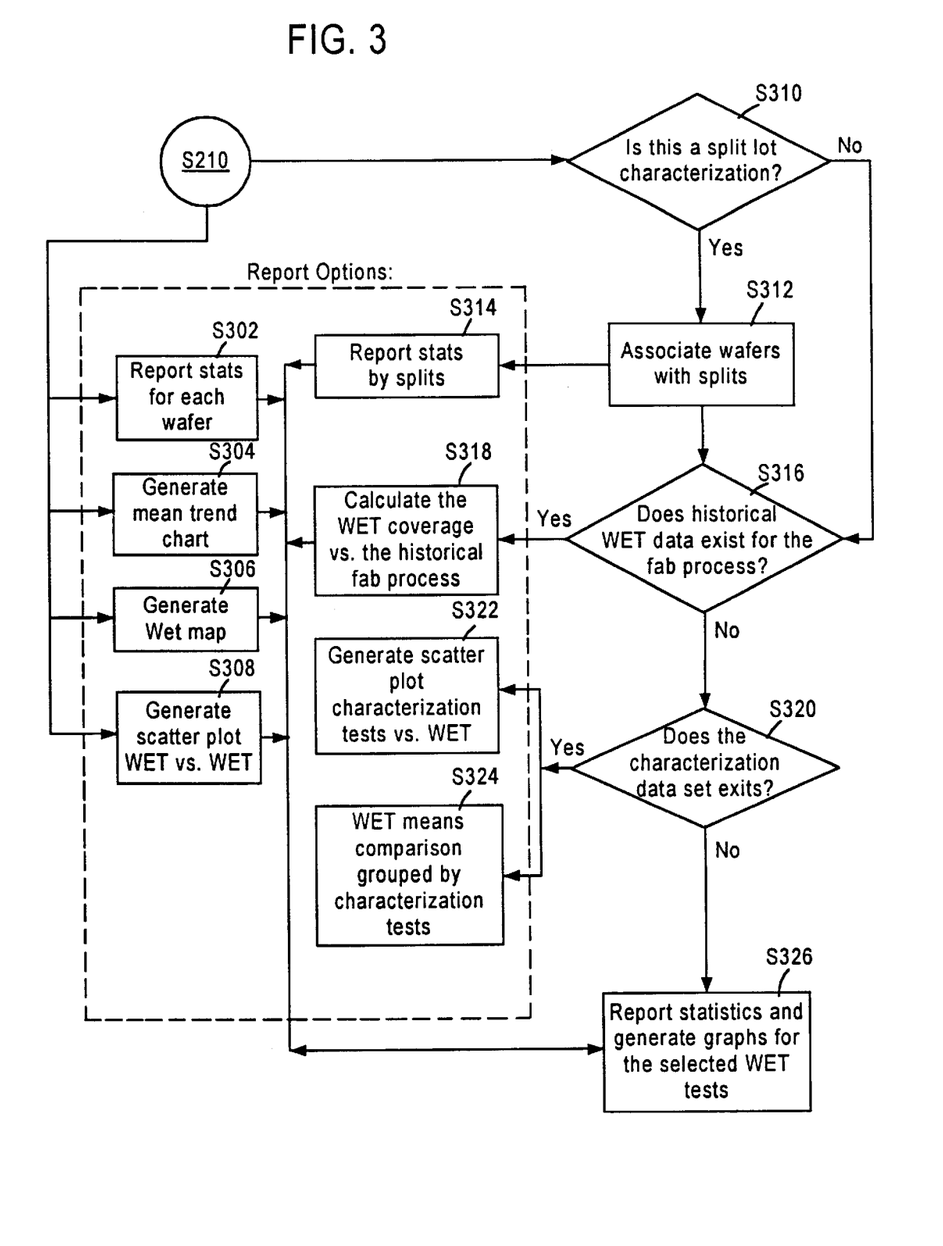
FIG. 3 is a flow chart illustrating the specific steps performed after compiling a WET data set from the flow chart illustrated in FIG. 2.

FIG. 3 is a flow chart illustrating the specific steps performed after receiving the WET data set. As shown in FIG. 3, the methodology of report generation includes generating a plurality of different report options, including basic report options as well as more relational-type options based on whether the analysis involves split lot characterization, historical WET data, or characterization data, as described below. At a minimum, the RS/1 server 156 generates report statistics for each wafer in step 302, generates a mean trend chart in step 304, generates a WET map in step 306, and generates a scatter plot WET versus WET report in step 308. The report options illustrated in FIG. 3 can be selected by the user of the client device 102 by selecting the desired reports from a main menu displayed by the browser, as illustrated in FIG. 7.

At step S302, statistical means are determined for the WET data set. This is accomplished by identifying each specific test parameter used in obtaining the measured results stored in the WET data set. Next, the actual measured values from the first data set are grouped together with corresponding test parameters in order to calculate the statistical mean for each test parameter in the first data set. In addition to calculating the statistical mean, various other values may be determined in order to assess the efficiency of the fabrication process. For example, the standard deviation for each test parameter may be determined in order to assess whether a normal distribution has been obtained for a particular test parameter during the fabrication process. Minimum and maximum values may also be determined in order to examine a spread of values for each test parameter and further identify the type of distribution obtained for the process.

The wafer WET map generated in step S306 provides a visual display that illustrates different physical locations, on the wafer, from which the measured results were obtained. For example, if one of the selected test parameters is the transition time from a high to a low state, then the statistical mean and other values for this test parameter are first calculated. Next, a visual representation of the location of tested semiconductor devices relative to the wafer is generated. If the distribution is very narrow, then the wafer WET map would indicate the locations on the wafer from which the measured results were obtained. Upon examining the wafer WET map, the designer is able to identify the location of specific semiconductor devices that provide satisfactory and unsatisfactory performance for a required function. Based on such identification, the designer may further decide that products for a particular customer should only be assembled from semiconductor devices formed on a specific area (e.g., top half, lower left quadrant, etc.) of the wafer.

The scatter plot generated in step S308 utilizes data from the WET data set, the characterization variables set, the historical data, and the limits set by the designer. Multiple test parameters are then plotted against: each other, the sorted net die per wafer values, as well as corresponding test parameters from the second data set.

At step 310, the client device 102 prompts the user (e.g., the designer or test engineer) as to whether or not split lots were used in the fabrication process. Split lots are groups of wafers that have been skewed or fabricated slightly differently from other groups although the end products are identical. For example, during an etching step, one lot may be processed by a dry etch technique, another lot may be processed by a wet etch technique using a first chemical composition; yet still another lot may be processed by a wet etch technique using a second chemical composition, etc. The performance of the semiconductor devices from each of the different lots described above may be remarkably different. Additionally, a split lot may include a group of wafers that have been tested at different temperatures in order to access the performance of the semiconductor devices in hotter or colder environments.

If the designer or engineer at the client device 102 specifies a split lot characterization, the client device 102 sends a command to the host data server 124 (via the web server 128) to associate wafers with splits in step 312. Specifically, the web browser in the client device 102 sends a command to the web server 150 of FIG. 1B; the web server 150 executes either a CGI script or an RPL function call to the library 154, which executes a routine for the generation of the report statistics by splits in step S314. As described above, the data may be stored in a SQL-type database (e.g., an Oracle database), or a may be stored as ASCII data files. The analysis software executed by the server 156 associates the appropriate data for generation of the report statistics by splits in step S314.

At step S314, the statistical mean and other pertinent values (e.g., minimum and maximum values, and standard deviation) are calculated for each test parameter within each split. Once the wafers belonging to a split are identified, measured results from the first data set corresponding to each test parameter are grouped together for such wafers. For example, if wafers C1–C5 belong to split lot number 3, then the values for each test parameter from wafers C1–C5 would be grouped together.

If the engineer specifies that the characterization is not a split lot characterization, the engineer is then prompted by the client device 102 in step 316 as to whether historical WET data exists for the fabrication processes associated with the manufacture of the corresponding semiconductor device. If historical WET data exists, the client device 102 sends a request to the web server 150, causing the execution of a routine in the library 154 by the server 156 of calculating the lot WET coverage versus the historical fabrication processes in step S318. The historical data corresponds to data that has been collected during previous runs of the fabrication process of the semiconductor device. The historical data typically contains information pertaining to the results of the last thirty (30) completed fabrication processes. For example, the historical data may include measured results obtained from tests performed on the wafers and semiconductor devices during each of the thirty previous fabrication processes, characterization data identifying trends and/or problems encountered during each respective fabrication process, etc.

Specifically, the actual measured results stored in the WET data set are compared in step S318 to corresponding test parameters from the historical data in order to identify the standard deviation of the current lot relative to previously fabricated lots. Additionally, the statistical mean and other pertinent values determined for individual test parameters for the current lot are compared to corresponding parameters from the historical data. The comparison performed at step S318 allows the designer to determine whether changes or adjustments previously made to the fabrication process have been successful (i.e., resulted in improved yield, reduced distribution, etc.). The results of the comparison test may optionally be directed to an output device (such as a display device or a printer) in the form of a graph.

If in step S316 historical WET data does not exist for the fab process, then the engineer is prompted by the client device 102 in step 320 as to whether the characterization data set exists in step 320. If the characterization data set exists, then the client device 102 sends a request to the web server 150, causing the execution of a routine in the library 154 by the server 156 of generating a scatter plot characterization test versus WET report in step S322. The client 102 also sends a request causing execution by the server 156 of a report that specifies WET means comparison group by characterization tests in step S324. However, if in step 320 characterization data set does not exist for the semiconductor device, then the client device 102 sends a request causing the server 156 to report statistics and generate graphs for the selected WET tests in step S326 based on the reports generated in steps S302, S304, S306, and S308. Hence, different report options may be selected based upon the availability of characterization data sets, historical WET data and split lot characterizations.

Figure 4:
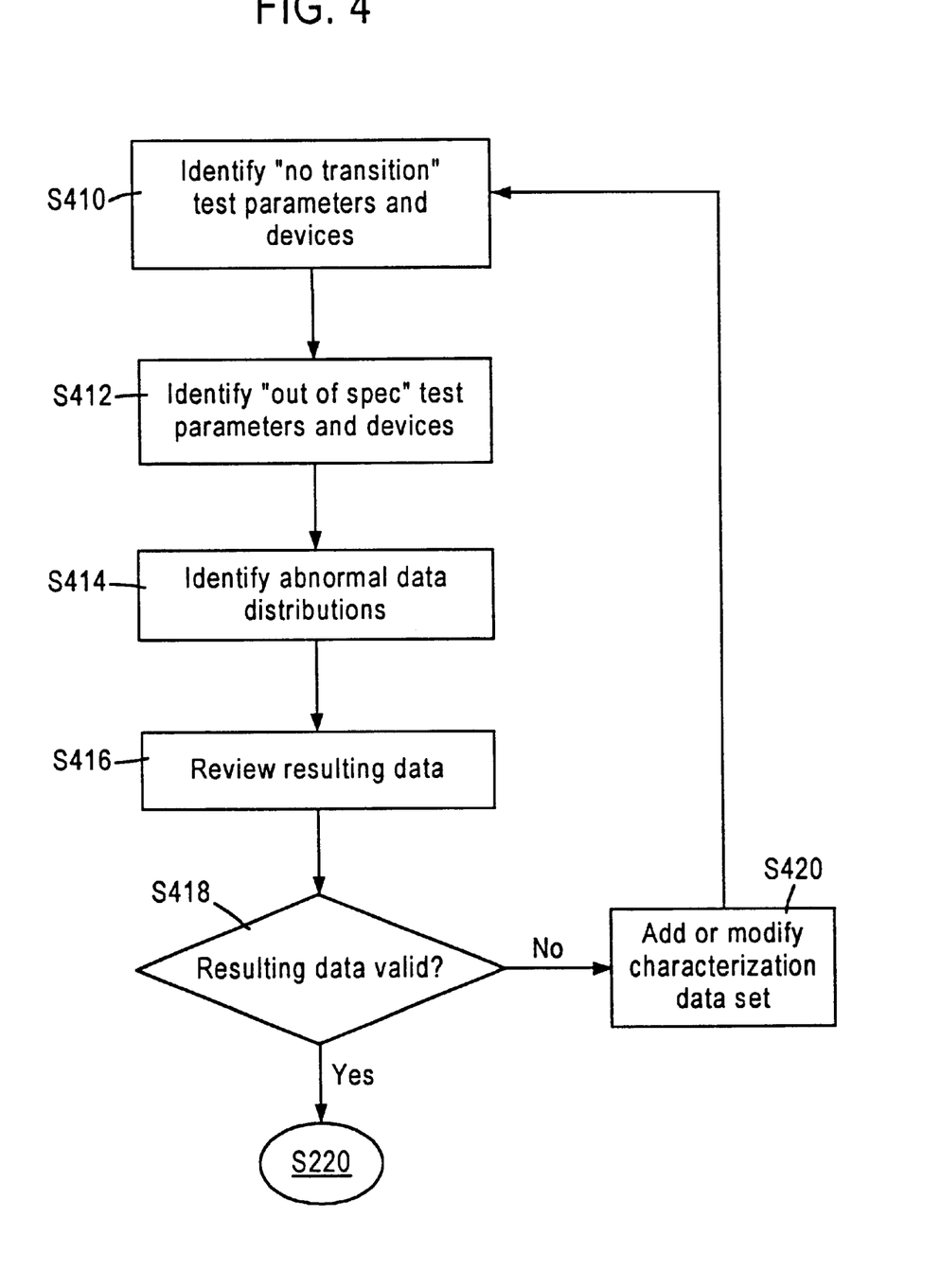
FIG. 4 is a flow chart illustrating the steps performed in analyzing the measured results from the characterization tests to identify valid measurements according to an embodiment of the present invention.

FIG. 4 is a flow chart illustrating, in detail, additional steps performed in comparing the measured results from the WET data set to the design characteristics from the characterization variables (i.e., step S214 of FIG. 2). Key parameters that are important to the final product or the customer are first identified. For example, a customer may require that semiconductor devices to be packaged in a particular chip transition between a high state and a low state within a prescribed time interval. Accordingly, test parameters that determine a transition time for the semiconductor devices would be identified, while test parameters that determine, for example, current flow (i.e., a non-key parameter) would not be identified. The key parameters may be interactively input by the designer, or they may be retrieved from the second data set.

It should be noted that the parameters discussed hereinbelow are only illustrative and do not represent the exact parameters that may be compared or the actual number of parameters that may be tested and compared. At step S410, semiconductor devices that do not transition between states are identified. The actual measured results for specific test parameters from the first data set are compared to corresponding design characteristics. Those semiconductor devices that do not meet the threshold transition times, or do not transition at all, are identified. Next, at step S412, semiconductor devices that produce measured results that fall outside the design characteristics are identified as being "out of spec". Semiconductor devices that produce measured results that are outside the limit parameters input by the designer are also identified as "out of spec" devices. At step S414, measured results from the WET data set that are considered abnormal are identified as "outliers". During step S414, the measured results from the WET data set are compared to corresponding values from both the second data set and other splits, at the same temperature and supply voltage ($V_{cc}$)

At step S416, the resulting data (i.e., identified semiconductor devices) is presented for review by the designer. At step S418, the designer determines if the resulting data is satisfactory. If the resulting data is satisfactory, then control passes to step S220, where the server 156 generates characterization reports including a list of valid and invalid semiconductor devices (and/or test results). If the resulting data is not satisfactory, then the designer modifies various parameters at step S420. For example, the limit parameters may be adjusted to redefine the "out of spec" devices. Design characteristics from the second data set may also be modified to redefine "no transition" devices or "outliers". Once the designer has completed modification of the parameters, control passes to step S410. This process is repeated until the designer is satisfied with the data results. The list generated at step S220 thus contains both semiconductor devices whose measured test results are satisfactory to the designer, and semiconductor devices whose measured test results are unsatisfactory.

Figure 5:
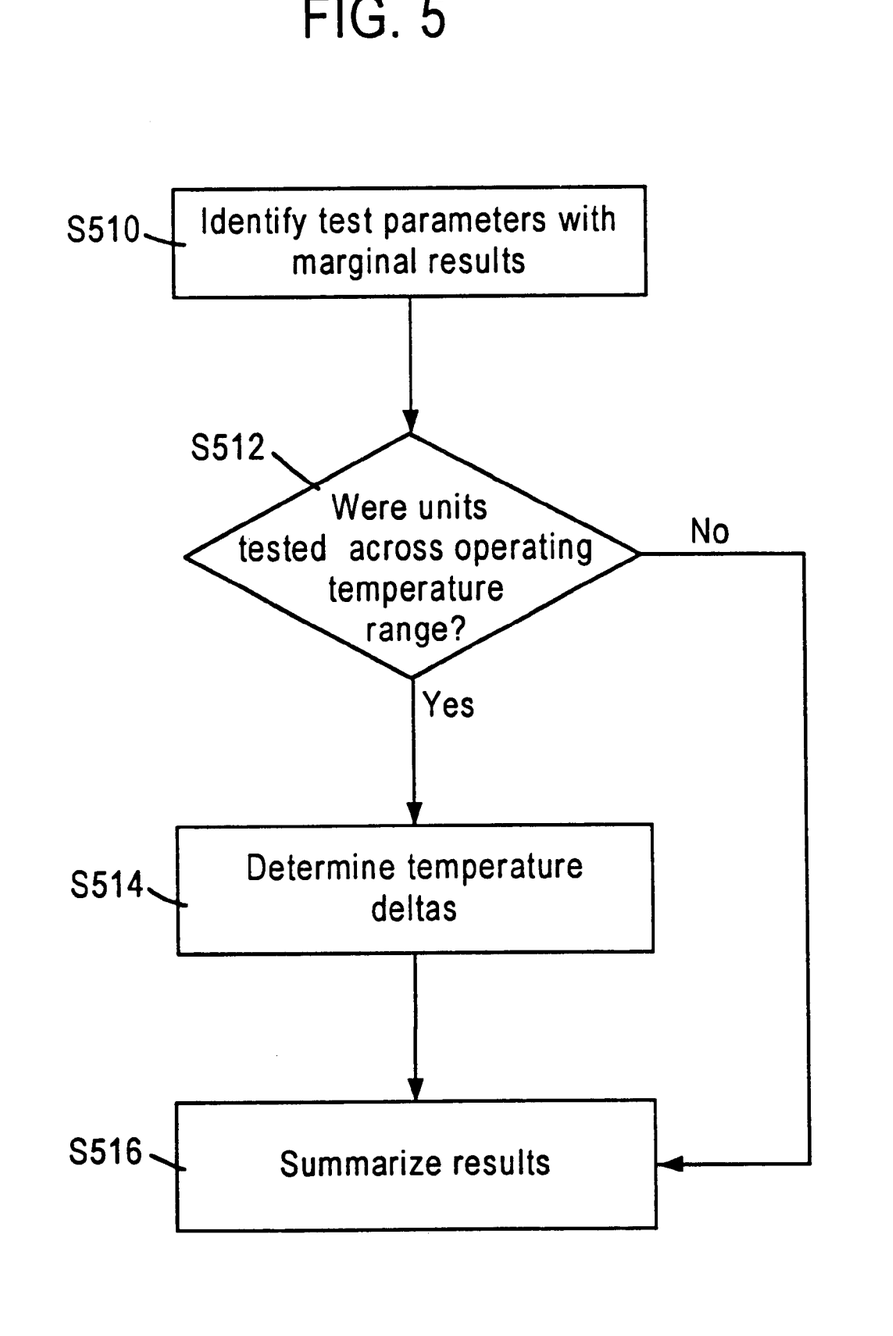
FIG. 5 is a flow chart illustrating the steps performed to generate the characterization reports.

FIG. 5 is a flow chart illustrating, in greater detail, the steps performed to generate the characterization data in step S214 of FIG. 2. At step S510, measured results for the semiconductor devices are examined, and semiconductor devices with marginal results are identified by the server 156. A semiconductor device is considered to have a marginal result for a test parameter if a predetermined standard deviation factor places the measured value (for the test parameter) outside of the design characteristics from the second data set, or outside of the limit parameters input by the designer. According to one embodiment of the present invention, a semiconductor device is considered to have a marginal result if the addition of a standard deviation factor of +/−3 places the measured result outside the limit parameters input by the designer.

The semiconductor devices with marginal parameters provide an indication of possible failure to the designer. For example, if a customer requires that an assembled chip be able to exhibit a certain performance characteristic, and a particular semiconductor device produces a marginal result for the performance characteristic, then it is very likely that the assembled chip will perform marginally or unstably. Accordingly, the designer may request that chips for the customer be assembled with semiconductor devices that do not exhibit marginal results. Such semiconductor devices may be selected, for example, from different areas of the wafer based on the wafer WET map generated at step S306.

At step S512, it is determined whether the units were tested across operating temperature range. In particular, if the units were tested across the entire operating temperature range specified in the product data sheet or as specified by the engineer, then the temperature deltas for the units are determined in step S514 by the analysis software on the server 156.

A temperature delta is defined as the difference of the sample data median value (i.e., from the first data set) between temperatures. The temperature delta is used to determine a temperature guardband. The temperature guardband is added to or subtracted from the limit parameters, depending on whether the delta (i.e., slope) is positive or negative, in order to create test ranges that ensure rejection of all failures at other temperatures from a single pass testing.

The various temperature splits are first identified, and various statistical values (e.g., mean, median, standard deviation, etc.) are determined for every test parameter in each of the splits. Next, the change in statistical values between splits is determined for each test parameter. Since the split lots are tested at different temperatures, the determined changes in statistical values represent variations in measured results of the test parameters relative to different test temperatures. Based on the determined temperature deltas, the tested semiconductor devices may be categorized in various ways. For example, semiconductor devices that do not exhibit a change in measured values over different temperatures may be grouped into a particular category, semiconductor devices that exhibit minor changes may be grouped into a second category, etc.

According to one embodiment of the present invention, the designer may provide a nominal operating temperature for the microchip (or final product) that will be assembled from the fabricated devices. Semiconductor devices that exhibit a poor performance relative to the operating temperature are then grouped into a category that, for example, prevents such devices from being incorporated into the assembled microchip. Additionally, various "deltas", aside from temperature, may be calculated. For example, the split lots may be defined based on different supply voltages ($V_{cc}$). Hence, supply voltage deltas would be calculated.

At step S518, the characterization results are summarized and presented to the designer. The data may be summarized in a variety of ways. For example, the designer may interactively request the data summary for specific test parameters, or the test parameters can be included in one of the data files in order to automate the data summary process. If no test parameters are provided, then the data is summarized for all of the test parameters. The data summary includes information corresponding to the measured values such as minimum, maximum, mean, median, +/−3 standard deviation, etc. The results presented in the data summary are determined for all or selected test parameters. If split lots were used, then the results of the data summary reflect the combined wafers in the splits. The measured data may be further categorized based on the different supply voltages ($V_{cc}$) or temperatures used during the fabrication process.

Figure 8:
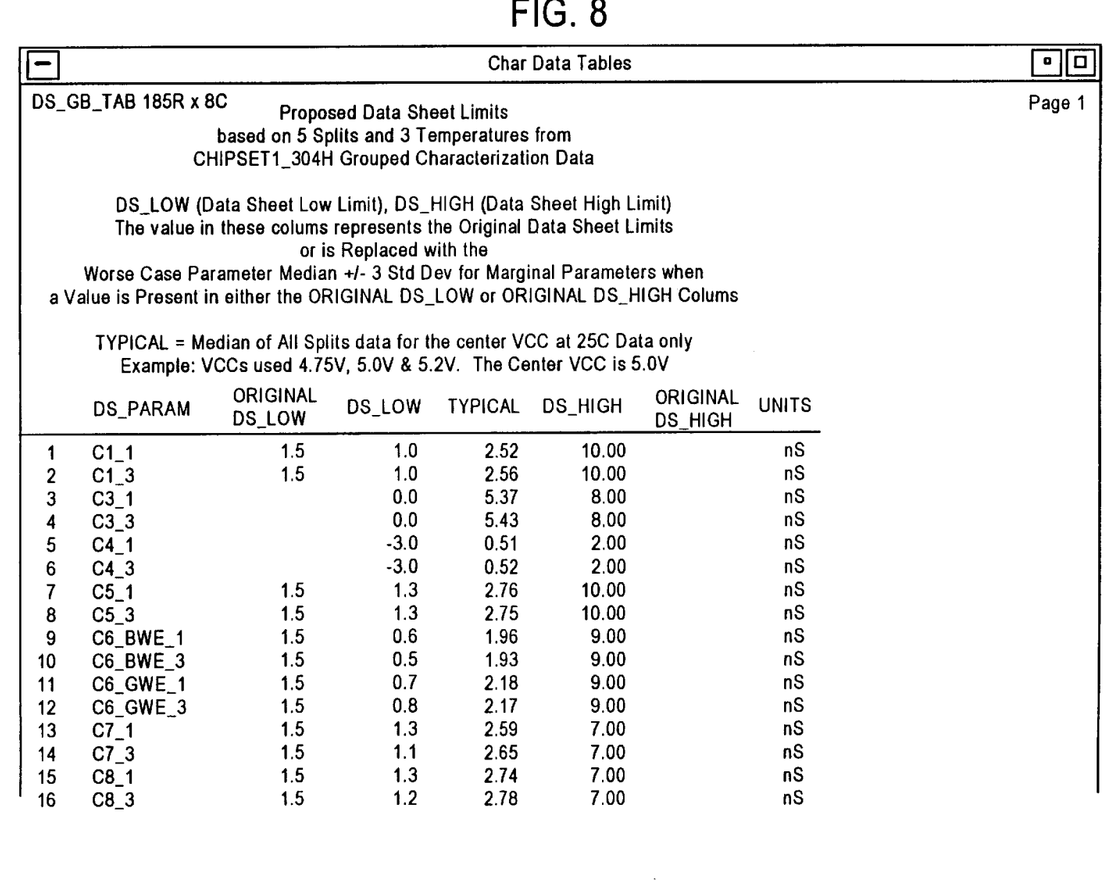
FIG. 8 is a diagram illustrating a proposed product data sheet generated according to an embodiment of the present invention.

The data summary includes worst case parameters that are calculated for the categorized supply voltages and temperatures. Finally, proposed limit parameters are generated based on the worst case parameters, standard deviation, etc. Based on the data summary, the designer is able to ascertain where changes should be made to the proposed data sheet, illustrated in FIG. 8.

The present method and arrangement advantageously allows characterization data for a semiconductor device to be quickly and consistently generated, by comparing measured test results from fabricated semiconductor devices with predetermined design characteristics. Hence, the process of comparing WET parameters, sort/class yield, and data variables is rendered simpler and more informative. The present method compares measured values from the semiconductor device to specific design characteristics, limit parameters, and historical data in order to identify valid and invalid semiconductor devices and/or test results. Additionally, a designer may interactively select test parameters to be analyzed or selectively remove data that is determined to be inaccurate. The characterization data is generated based on the identified valid semiconductor devices and/or test results.

The characterization data provides summaries of different tests performed on the semiconductor device. Various display options are available to view the test results in the form of graphs, illustrated in FIG. 6. The display options allow the designer to view test results from one or more test parameters that can be either automatically selected or input by the designer. The display options also allow the designer to view scatter plots that display the results of multiple tests on selected test parameters in a single screen display. Additionally, worst case parameters are identified and the designer is automatically provided with limit parameters that function as guidelines for the fabrication process.

The method of the present invention may be implemented on various types of computer systems operating on different platforms. For example, as previously described according to an embodiment of the present invention, a web browser may be used as an interface for implementing the present invention. As can be appreciated by those skilled in the art, a web browser interface provides numerous benefits. For example, the selection of particular test results and displays is menu driven, hence allowing a designer to quickly select, change, and display test results. Additionally, the platform independency of the web browser interface allows cooperation and exchange of data between designers that are physically separated and using different computers and operating systems.

One advantage of the present method is that characterization data for complex semiconductor devices can be generated in a fraction of the time traditionally required, by quickly examining the data collected from the fabrication process. Additionally, the characterization data is accurately and consistently generated because prescribed parameters are used to identify valid and invalid semiconductor devices instead of human intuition from multiple engineers.

The automated analysis of the disclosed embodiment quickly identifies those characteristics test parameters that do not meet the expected performance limits. The engineer needs only to view the results to determine if the data results are valid or invalid due to test program, test equipment or test setup condition problems.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A computer-readable medium carrying one or more sequences of instructions for generating characterization data for a fabrication process in which semiconductor devices are formed upon at least one wafer, wherein execution of the one or more sequences of instructions by one or more processors causes the one or more processors to perform the steps of: receiving a first data set containing measured results obtained from tests performed on the semiconductor devices during the fabrication process;

receiving a second data set containing values corresponding to design characteristics for the semiconductor devices;

comparing the measured results from the first data set to the design characteristics from the second data set;

identifying semiconductor devices having valid and invalid performance characteristics, based on the step of comparing; and generating the characterization data for the fabrication process based on the identified valid semiconductor devices;

whereby the characterization data includes proposed limit parameters to which test results from said semiconductor devices will conform.

2. The computer-readable medium of claim 1, wherein the step of receiving a first data set further comprises the steps:

determining if split lots were used in the fabrication process to form the semiconductor devices;

receiving input, from a user, that identifies split lots to which each of the at least one wafer belongs; and generating one or more process characteristics for each split lot, based on the received input.

3. The computer-readable medium of claim 2, wherein the step of generating one or more process characteristics further comprises the steps:

combining measured results for semiconductor devices formed on wafers belonging to a selected split lot;

determining a statistical mean for the combined measured results of the selected split lot; and repeating the steps of combining and determining until all split lots have been identified.

4. The computer-readable medium of claim 1 wherein the one or more processors further perform the steps:

identifying a key test parameter;

determining net die per wafer value; and creating scatter plot that displays the results of the key test parameter relative to test parameters from the first and second data set.

5. The computer-readable medium of claim 1, wherein the one or more processors further perform the steps:

receiving a third data set corresponding to measured results from a prescribed number of previously fabricated wafers; and determining, based on the third data set, a current statistical mean and standard deviation of the measured results for the semiconductor devices on the at least one wafer.

6. The computer-readable medium of claim 1, wherein the step of receiving a first data set further comprises the steps:

receiving a test parameter from a user;

determining a statistical mean of the measured results corresponding to the received test parameter for each of the at least one wafer; and determining minimum and maximum values of the measured results corresponding to the received test parameter for each of the at least one wafer.

7. The computer-readable medium of claim 1, wherein the step of receiving further comprises the step of determining a statistical mean of each measured result for each of the at least one wafer.

8. The computer-readable medium claim 1, wherein the step of receiving a first data set further comprises the steps:

receiving at least two selected test parameters from a user;

determining a statistical mean of the measured results corresponding to the two selected test parameters, for each of the at least one wafer;

determining minimum and maximum values of the measured results corresponding to the two selected test parameters, for each of the at least one wafer; and determining a median and standard deviation of the measured results corresponding to the two selected test parameters, for each of the at least one wafer.

9. The computer-readable medium of claim 1, wherein the step of identifying semiconductor devices having valid and invalid performance characteristics further comprises the steps:

sequentially selecting a test parameter from test parameters used to obtain the measured results; and for each test parameter selected, performing the steps:

identifying measured results, from the first data set, corresponding to a selected test parameter for the semiconductor devices, identifying values, from the second data set, corresponding to design characteristic values for the selected test parameter, comparing the measured results identified from the first data set to the values identified from the second data set, and determining, based on the step of comparing the values, semiconductor devices that have measured results which do not conform to the design characteristics.

10. The computer-readable medium of claim 1, wherein the step of identifying semiconductor devices having valid performance characteristics further comprises the steps:

identifying values, from the first data set, corresponding to a voltage transition parameter that is measured from the semiconductor devices;

identifying values, from the second data set, corresponding to design characteristic values for voltage transition;

comparing the values identified from the first data set to the values identified from the second data set; and determining, based on the step of comparing the values, semiconductor devices that do not transition between a first state and a second state.

11. The computer-readable medium of claim 1, wherein the step of identifying semiconductor devices having valid and invalid performance characteristics further comprises the steps:

comparing measured results for each test parameter from the first data set to corresponding values from the selected data limits; and identifying semiconductor devices having measured results that fall outside a prescribed range of values.

12. The computer-readable medium of claim 11, wherein the one or more processors further perform a step of identifying devices whose test results produce abnormal values.

13. The computer-readable medium of claim 1, wherein the one or more processors further perform the steps:

determining a percentage of identified semiconductor devices that have invalid performance characteristics; and if the determined percentage value exceeds a predetermined threshold, then outputting a warning.

14. The computer-readable medium of claim 1, wherein the step of identifying further includes the step of removing, by a user, individual semiconductor devices that have measured results considered to be invalid.

15. The computer-readable medium of claim 1, wherein the step of generating further includes the steps:

selecting semiconductor devices having marginal performance characteristics; and determining a change for measured results for the semiconductor devices at different temperatures.

16. The computer-readable medium of claim 1, wherein the step of receiving the first data set includes the step of receiving the first data set from a remote location through the Internet, using a web browser interface.

17. The computer-readable medium of claim 1, wherein the step of receiving a second data set includes the step of receiving the second data set from a remote location through the Internet, using a web browser interface.

18. A system for generating characterization data for a fabrication process comprising:

a workstation configured to:

access a first data set containing measured results obtained from tests performed on said semiconductor devices during said fabrication process, access a second data set containing values corresponding to design characteristics for said semiconductor devices, compare the measured results from said first data set to the design characteristics from said second data set to thereby identify semiconductor devices having valid and invalid performance characteristics, and generate said characterization data for the fabrication process based on the identified valid semiconductor devices, whereby said characterization data includes proposed limit parameters to which test results from said semiconductor devices will conform; and a display operatively coupled to said workstation for displaying said characterization data.

19. The system of claim 18, further comprising a second workstation for storing said first and second data sets, said first workstation is further configured to execute a web browser for providing a communication platform for accessing said first and second data sets via the a packet data network.

20. The system of claim 18, wherein, upon accessing said first data set, said workstation is further configured to:

receiving a test parameter from a user;

determining a statistical mean of the measured results corresponding to the received test parameter for each of the at least one wafer; and determining minimum and maximum values of the measured results corresponding to the received test parameter for each of the at least one wafer.

21. The system of claim 18, wherein said first and second data sets are stored on a computer-readable medium.

22. The system of claim 18, wherein said workstation is further configured to identify said semiconductor devices having valid and invalid performance characteristics by performing the steps:

sequentially selecting a test parameter from test parameters used to obtain the measured results; and for each test parameter selected, performing the steps:

identifying measured results, from the first data set, corresponding to a selected test parameter for the semiconductor devices, identifying values, from the second data set, corresponding to design characteristic values for the selected test parameter, comparing the measured results identified from the first data set to the values identified from the second data set, and determining, based on the step of comparing the values, semiconductor devices that have measured results which do not conform to the design characteristics.

* * * * *